United States Patent [19]
Calio et al.

[11] Patent Number: 6,054,062
[45] Date of Patent: Apr. 25, 2000

[54] METHOD AND APPARATUS FOR AGITATING AN ETCHANT

[75] Inventors: Jeffrey C. Calio, Concord; Stephanie A. Yoshikawa, Palo Alto; Timothy Hendrix, San Jose, all of Calif.

[73] Assignee: LSI Logic Corporation, Milpitas, Calif.

[21] Appl. No.: 08/944,247

[22] Filed: Oct. 6, 1997

[51] Int. Cl.[7] .................................................. B44C 1/22
[52] U.S. Cl. ........................ 216/57; 134/37; 156/345 L; 156/345 LC; 216/83; 216/84
[58] Field of Search ..................... 156/345 L, 345 LC; 134/37; 216/57, 83, 84

[56] References Cited

U.S. PATENT DOCUMENTS

| | | | |
|---|---|---|---|
| 5,464,480 | 11/1995 | Mathews | 134/1.3 |
| 5,571,375 | 11/1996 | Izumi et al. | 156/646.1 |
| 5,698,046 | 12/1997 | Guldi et al. | 134/1.3 |
| 5,868,898 | 2/1999 | Liu et al. | 156/345 |

*Primary Examiner*—Edward J. Cain

[57] ABSTRACT

A method and apparatus agitates an etchant contained within a bath. A wafer is immersed in a bath containing an etchant that is continuously mixed by release of a gas, preferably nitrogen, into the bath at a sufficient flow rate to agitate the etchant and assure a robust and substantially uniform selective etching process. The apparatus comprises valve assembly that receives gas from a source of gas under pressure and controls the flow rate and release pressure of the gas. In addition, the valve assembly contains an on/off valve that, when turned on, releases gas for a predetermined time period. Accordingly, a single operation of the on/off valve releases gas for the duration of a single selective etching cycle. A dispersion plate receives the gas from the valve assembly for release into the bath. The released gas passes through the baffle distribution plate that distributes the gas throughout the bath. The flowing gas agitates the etchant and the amount of agitation is controlled by controlling the pressure and flow rate of the gas.

14 Claims, 2 Drawing Sheets

METHOD AND APPARATUS FOR AGITATING AN ETCHANT

BACKGROUND OF THE INVENTION

1. Field of the Invention

This invention pertains in general to semiconductor manufacturing using a wet selective etch process and in particular to a method and apparatus for agitating the etchant used in such a process.

2. Description of Background Art

Selective etching is a process in which selected material is removed from a silicon substrate or from thin films on the substrate surface. In one type of selective etching, a mask layer is used to protect specific regions of a substrate on a wafer surface. Then, a selective etch removes material not covered by the mask. In another type of selective etching, self-aligned silicide (salicide), a metal is deposited over the substrate structure and reacted with exposed silicon areas to form a silicide. Then, a selective etch removes the unreacted metal without attacking the silicide.

In a wet selective etching process, the substrate is etched through exposure to a liquid etchant. The liquid etchant removes a predetermined amount of the uncovered or unreacted material and, thereby, forms patterns in the substrate. The wet etching process is typically carried out by immersing a cartridge holding multiple wafers in an etchant bath. The bath is typically a quartz pot holding, for example, five gallons of etchant. The etchant is usually a combination of chemicals. When the material being etched is titanium silicide, for example, a standard selective etchant includes ammonium hydroxide, hydrogen peroxide, and water. This combination is non-viscous and is easily mixed.

Etchants containing one or more viscous chemicals, in contrast, require frequent and vigorous mixing to keep the chemicals from separating while in the bath. For example, an etchant of sulfuric acid and hydrogen peroxide can be used for cobalt silicide selective etching. Sulfuric acid is viscous and tends to separate from the hydrogen peroxide. Even the exothermic reaction caused by mixing the two chemicals is insufficient to keep the etchant properly mixed. Accordingly, the etchant must be agitated while the wafers are in the bath.

Various techniques have been developed to stir the etchant mixture while the wafers are immersed in the bath. One such technique is to place a magnetic stirrer at the bottom of the bath. Then, a magnetic wheel beneath the bath is used to move the stirrer. However, this technique does not work well when the etchant has a very high viscosity.

Another technique is to manually stir the etchant mixture with a paddle. This technique, however, is very expensive because a person must stir the bath during the entire etching process, typically lasting 20 minutes. In addition, the person may be subject to repetitive motion injury due to the frequent stirring. The person may also be subject to harm from the chemicals contained in the etchant.

Accordingly, there is a need for a way to keep a high-viscosity etchant from separating while in the bath without using manual labor.

SUMMARY OF THE INVENTION

In accordance with the method and apparatus of the present invention, gas is used to agitate an etchant in a bath. An etchant, such as sulfuric acid and hydrogen peroxide, is placed in the bath. Then, one or more wafers held in a cassette are immersed in the etchant for selective etching. While the wafers are in the bath, gas bubbles are released into the bath at a sufficient rate to agitate the etchant and thereby ensure that robust etching takes place. The flowing gas also cools the etchant.

The apparatus for releasing the gas comprises a valve assembly coupled to a dispersion plate and a baffle distribution plate above the dispersion plate. A flow limiter within the valve assembly receives gas from a gas source that preferably provides 99.995% pure nitrogen, although other inert gasses may also be used. The flow limiter limits the total gas flow from the gas source through the apparatus.

The regulator receives the gas that passes through the flow limiter and lowers the operating pressure of the gas to 60 pounds per square inch (psi). This pressure is optimal to agitate approximately four gallons of an etchant comprised of three parts sulfuric acid and one and one half parts hydrogen peroxide.

The gas from the regulator is passed to the adjustable flow meter that fine tunes the gas flow in order to properly agitate the etchant. The on/off valve receives the gas from the adjustable flow meter and controls the flow of the gas through the entire agitation apparatus. The on/off valve is preferably connected to a timer so that the agitation is automatically turned off at the end of the etching cycle. Accordingly, the on/off valve only needs to be activated once during the etching cycle. If the etchant will be discarded after etching, then the on/off valve preferably continues the gas flow after etching to keep the etchant cool until disposal.

The gas flows from the on/off valve into a tube that extends into the bath. Near the bottom of the bath, the tube is curved to form a "U" shaped dispersion plate roughly parallel with the bottom of the bath. The dispersion plate is perforated with holes through which the gas can escape.

A baffle distribution plate is disposed within the bath to encounter the gas escaping the dispersion plate. The baffle distribution plate is perforated with holes and dimensioned to substantially distribute the encountered gas. In this manner, the gas agitates and cools the etchant.

DETAILED DESCRIPTION OF THE PREFERRED EMBODIMENTS

Figure 1:
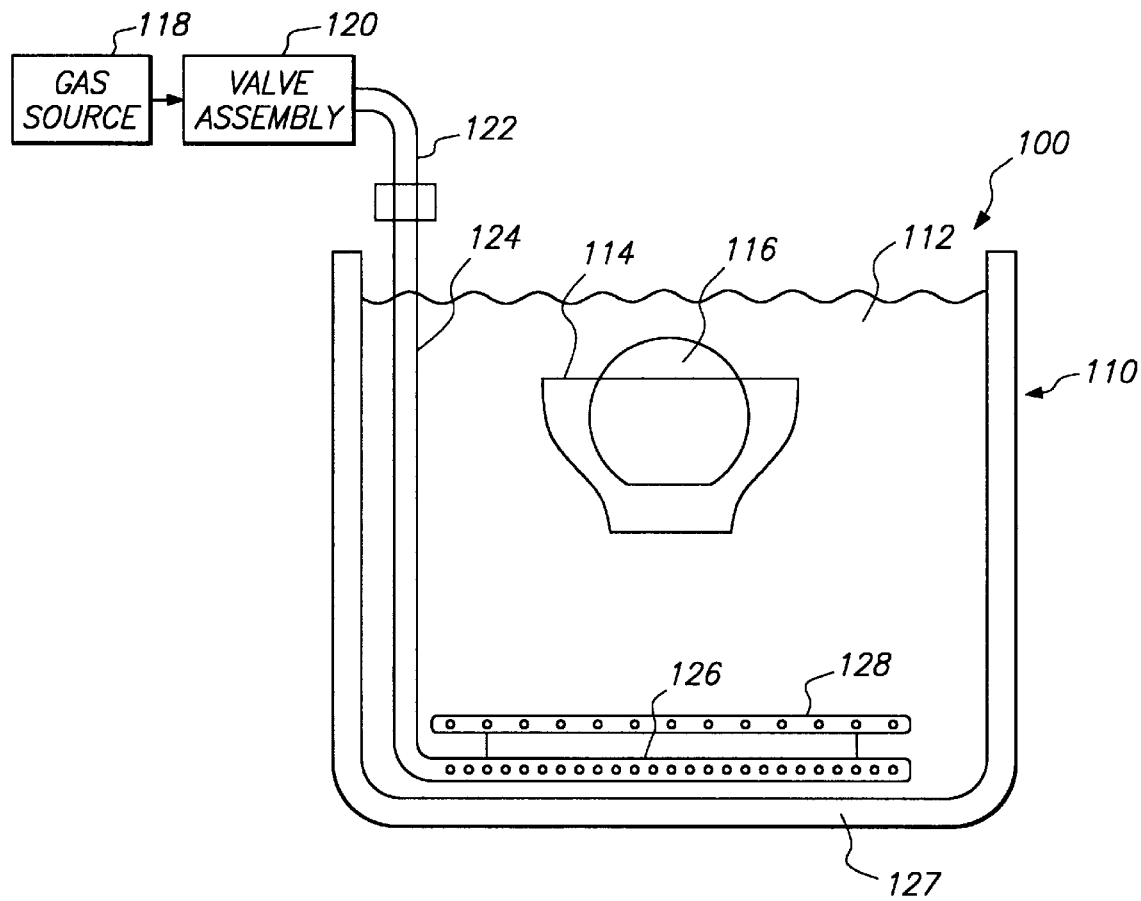
FIG. 1 is a cutaway side view of an etchant bath having a gas bubble agitation system according to the present invention.

FIG. 1 is a cutaway side view of an etchant bath 100 having a gas bubble agitation system according to the present invention. FIG. 1 is not drawn to scale. Shown are the bath walls 110, an etchant 112 within the bath 100, and a cartridge 114 holding at least one wafer 116. Also shown are a gas source 118, a valve assembly 120 coupled to the gas source 118, a flexible tube 122 coupled to the valve assembly 120, a quartz tube 124 coupled to the flexible tube 122, a dispersion plate 126 coupled to the quartz tube 124, and a baffle distribution plate 128 positioned above the dispersion plate 126.

The bath walls 110 are preferably made of quartz or another non-reactive substance and form a bath 100 holding approximately four gallons of etchant. Of course, the exact size of the bath may vary except to the extent that the bath 100 should hold at least one cassette 114 of wafers 116 and the gas bubble agitation system.

The etchant 112 is within the bath 100. The present invention uses an etchant comprised of three parts sulfuric acid and one and one half parts hydrogen peroxide. This etchant chemistry has a high viscosity and requires continuous agitation to stay mixed and to allow the reactive products to move away from the wafers 116. However, the chemistry of the etchant 112 depends upon the desired selective etching characteristics. The present invention may be used with any etchant for which agitation is required or desired.

The cartridge 114, or "boat," holds between one and twenty-five wafers. The primary purpose of the cartridge 114 is to hold the wafers 116 in an ordered configuration while the wafers 116 are immersed in the etchant bath 100. In one embodiment of the present invention, the cartridge 114 holds standard six-inch silicon wafers coated with cobalt silicide via a sputtering process after annealing. In addition, the bath 100 may hold more than one cartridge 114 of wafers.

The gas source 118 preferably supplies pressurized nitrogen gas because it will not react with the other chemicals in the bath 100. Accordingly, other inert gasses may be substituted for nitrogen. A preferred embodiment of the gas source supplies 99.995% pure nitrogen gas. The gas source is coupled to the valve assembly 120.

Figure 2:
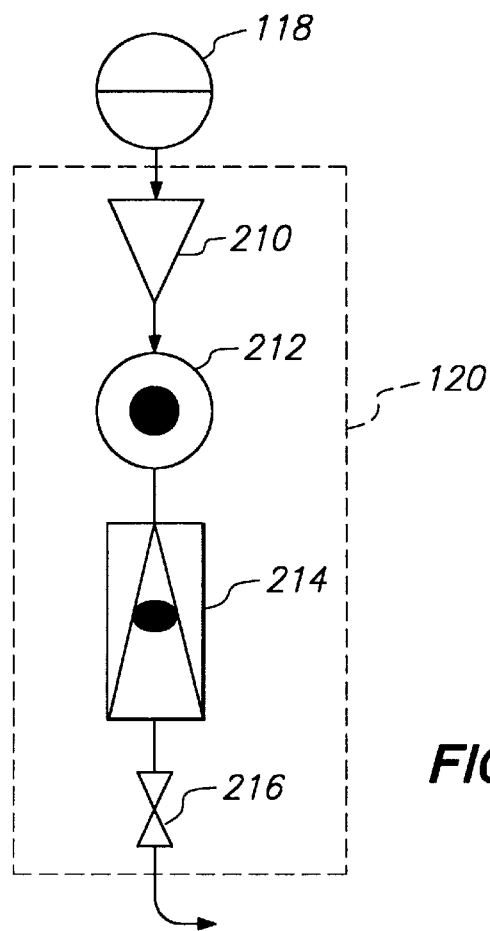
FIG. 2 is a block diagram illustrating a gas supply and a valve assembly of the gas bubble agitation system of FIG. 1.

FIG. 2 is a block diagram illustrating the gas supply 118 and the valve assembly 120. A flow limiter 210 receives the gas from the gas supply 118 and limits total gas flow to the downstream components in the valve assembly 120 for purposes of safety. The flow limiter 210 preferably limits the maximum possible flow to a rate of 2.5 liters/minute (lpm).

The gas flows from the flow limiter 210 to a regulator 212 that lowers the operating pressure of the gas to about 60±5 pounds per square inch (psi). This operating pressure is optimal for agitating the sulfuric acid and hydrogen peroxide etchant described above. The optimal operating pressure, however, varies depending upon the viscosity and volume of etchant in the bath 100.

The gas flows from the regulator 212 to an adjustable flow meter 214 that performs fine adjustments on the rate of gas flow in order to control the amount of agitation produced in the bath 100. A preferred adjustable flow meter 214 allows the gas flow to vary between about three and 10 standard cubic feet per hour (scfh). A preferred setting for the adjustable flow meter 214 provides gas at a flow rate of five scfh.

The gas flows from the adjustable flow meter 214 to an on/off valve 216 which, when turned on, allows gas to flow through the valve assembly 120. The on/off valve 216 is preferably a quarter-turn valve that allows gas to flow for about 20 minutes when activated. Accordingly, the on/off valve 216 needs to be activated only once to provide agitation for an entire 20-minute selective-etch process.

The gas flows from the valve assembly 120 into a flexible tube 122 that is preferably made of TEFLON. The flexible tube 122 is coupled to a quartz tube 124. Like the bath walls 110, the quartz tube 124 is used because it does not react with the etchant 112. The tube 124 can also be formed from other non-reactant materials.

The quartz tube 124 extends toward the bottom wall 127 of the bath 100. Near the bottom wall 127, the tube 124 preferably curves so that it is roughly parallel with the bottom wall 127 of the bath 100. This curved section of the tube 124 forms a dispersion plate 126 and has a plurality of holes through which the gas escapes.

The baffle distribution plate 128 is disposed above the dispersion plate 126 to promote substantially uniform distribution of gas escaping through holes in the dispersion plate 126. The baffle distribution plate 128 is preferably bolted to the bath walls 110 to disburse the gas flow throughout the bath 100. The disbursed gas travels upwards through the bath and agitates the etchant solution 112.

Figure 3:
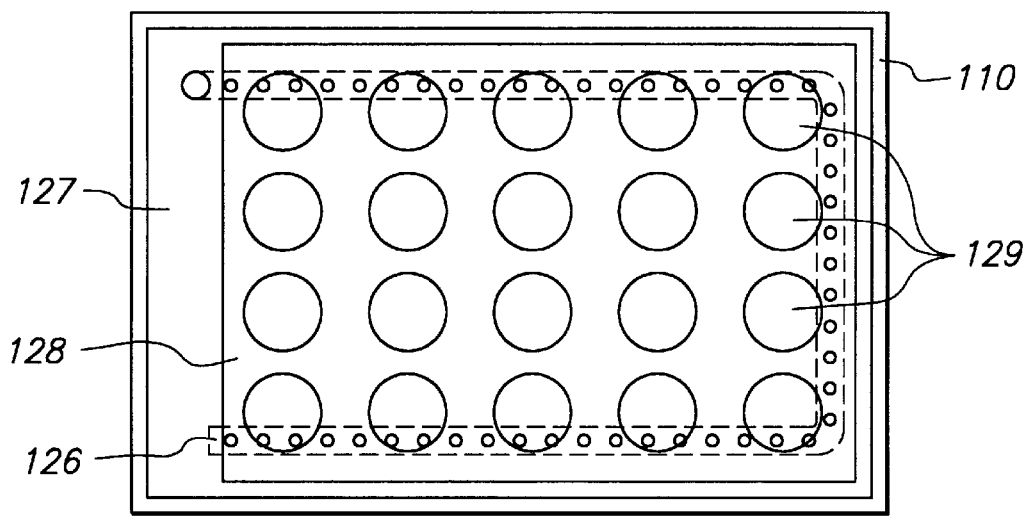
FIG. 3 is a top-down view of the bath and agitation system of FIG. 1.

FIG. 3 is a top-down view illustrating the bath 100 and mixing system of FIG. 1. The dispersion plate 126 is dashed to indicate that it is below the baffle distribution plate 128.

As can be seen in FIG. 3, the dispersion plate 126 is preferably curved in an elongated "U" shape in order to cover a greater surface area of the bottom wall 127 of the wall 100. Other dispersion plate 126 shapes, such as circular or spiral shapes, can also be used. The dispersion plate 126 is perforated to allow gas under pressure therein to escape.

The distribution baffle plate 128 preferably has dimensions of approximately the width and length of the dispersion plate 126, and may extend to cover the entire area of the bath 100. The baffle plate 128 is perforated with a plurality of holes 129 of approximately ½ inch diameter. These perforations cause the gas to spread substantially evenly through the bath 100 as the gas flows upwards through the bath 100.

The flow rate of about five scfh of the gas under pressure generates a sufficient amount of agitation in the etchant to effect substantially uniform selective etching of the wafers 116. Lower flow rates can be used if the etchant is less viscous or if the lower flow rate is otherwise sufficient. Higher flow rates of gas under pressure for higher levels of agitation may also be used, although the high level of agitation may create safety problems due to overflowing or splashing etchant.

An additional advantage of the present invention is that the flowing gas cools the etchant. This cooling effect is beneficial if the etchant will be discarded after etching. In such cases, the on/off valve continues the gas flow after the etching cycle has completed, thereby keeping the etchant cool until it is discarded.

Therefore, present invention is a method and apparatus for agitating a highly viscous etchant while selectively etching a substrate within the bath. The present invention releases and disburses gas at a controlled pressure and rate within the bath, thereby agitating the etchant. The amount of agitation in the bath is controlled by adjusting the gas pressure and flow rate.

What is claimed is:

1. A method of selectively etching a wafer, the method comprising the steps of:

immersing the wafer in an etchant within a bath;

supplying a gas to the bath;

controlling a pressure and flow rate of the supplied gas;

releasing the gas in the bath from a location below the wafer at the controlled pressure and flow rate to agitate the etchant within the bath; and removing the wafer from the etchant.

2. The method of claim 1, wherein the releasing step releases the gas for a predetermined time period.

3. The method of claim 1, wherein the controlling step comprises the substeps of:

limiting a maximum flow rate of the gas;

regulating the pressure of the gas at the limited flow rate; and adjusting the flow rate of the gas at the regulated pressure;

wherein the releasing step releases the gas at the regulated pressure and adjusted flow rate.

4. The method of claim 1 of selectively etching the wafer in an etchant comprising hydrogen peroxide and sulfuric acid, wherein the supplying step supplies nitrogen gas.

5. The method of claim 1, further comprising the step of:

disbursing the released gas throughout the bath.

6. An apparatus for agitating an etchant in a bath, the apparatus comprising:

a supply of pressurized inert gas;

a valve coupled to the gas supply for releasing the gas at a controlled pressure and flow rate; and a dispersion plate perforated with a plurality of holes within the bath and receiving the gas released by the valve for releasing the gas through the plurality of holes into the bath at the controlled pressure and flow rate for agitating the etchant in the bath.

7. The apparatus of claim 6, wherein the dispersion plate is located near a bottom of the bath.

8. The apparatus of claim 6 in which the etchant comprises hydrogen peroxide and sulfuric acid and the supply comprises nitrogen gas.

9. The apparatus of claim 6, wherein the valve is coupled to a valve assembly comprising:

a flow limiter coupled to the gas supply for releasing the gas at a limited flow rate;

a regulator receiving the gas released by the flow limiter for releasing the gas at the controlled pressure;

an adjustable flow meter receiving the gas released by the regulator for releasing the gas to the dispersion plate at the controlled flow rate.

10. The apparatus of claim 6, wherein the valve further comprises:

an on/off valve capable of being activated and receiving the gas released by the adjustable flow meter for releasing the gas to the dispersion plate for a fixed time period upon activation.

11. The apparatus of claim 6, wherein the valve releases the gas at a rate of about five scfh.

12. The apparatus of claim 6, further comprising:

a baffle distribution plate within the bath and above the dispersion plate for disbursing gas released by the dispersion plate throughout the bath.

13. The apparatus of claim 12, wherein the baffle distribution plate includes a plurality of perforations through which the released gas flows.

14. The apparatus of claim 13, wherein the plurality of perforations are each about ½ inch in diameter.

* * * * *